United States Patent
Nakamura et al.

(10) Patent No.: US 7,407,873 B2
(45) Date of Patent: Aug. 5, 2008

(54) METHOD OF MANUFACTURING SEMICONDUCTOR DEVICE

(75) Inventors: Hiroki Nakamura, Ageo (JP); Terunori Warabisako, Nishitama-gun (JP); Masakiyo Matsumura, Kamakura (JP)

(73) Assignee: Advanced LCD Technologies Development Center Co., Ltd., Yokohama-shi (JP)

( * ) Notice: Subject to any disclaimer, the term of this patent is extended or adjusted under 35 U.S.C. 154(b) by 44 days.

(21) Appl. No.: 11/187,850

(22) Filed: Jul. 25, 2005

(65) Prior Publication Data

US 2006/0024981 A1 Feb. 2, 2006

(30) Foreign Application Priority Data

Jul. 28, 2004 (JP) ............... 2004-220448

(51) Int. Cl.
*H01L 21/20* (2006.01)

(52) U.S. Cl. .............. 438/487; 438/489; 438/764; 438/795

(58) Field of Classification Search ......... 438/486–489, 438/166, 187, 198, 365, 417, 764
See application file for complete search history.

(56) References Cited

U.S. PATENT DOCUMENTS

2002/0013114 A1* 1/2002 Ohtani et al. ............ 445/23
2002/0047580 A1* 4/2002 Kunii et al. ............ 315/169.3
2003/0013280 A1 1/2003 Yamanaka

FOREIGN PATENT DOCUMENTS

| CN | 1495847 A | 5/2004 |
|---|---|---|
| JP | 3204986 | 6/2001 |

OTHER PUBLICATIONS

Dharam Pal Gosain, et al., "Formation of (100)-Textured Si Film Using and Excimer Laser on a Glass Substrate", Jpn. J. Appl. Phys., vol. 42, Part 2, No. 2B, Feb. 15, 2003, pp. L135-L137.

Hiroyuki Kuriyama, et al., "Enlargement of Poly-Si Film Grain Size by Excimer Laser Annealing and Its Application to High-Performance Poly-Si Thin Film Transistor", Japanese Journal of Applied Physics, vol. 30, No. 12B, Dec. 1991, pp. 3700-3703.

Akira Fukami, et al., "Improvement in Crystalline Quality of Silicon on Fused Silica by Zone Melting Recrystallization", Journal of Electronic Communications Society, vol. J69-C, No. 9, Sep. 1986, pp. 1089-1095.

Masakiyo Matsumura, "Preparation of Ultra-Large Grain Silicon Thin-films by Excimer-Laser", Surface Science, vol. 21, No. 5, 2000, pp. 278-287.

* cited by examiner

*Primary Examiner*—Dung A. Le
(74) *Attorney, Agent, or Firm*—Oblon, Spivak, McClelland, Maier & Neustadt, P.C.

(57) ABSTRACT

A method of manufacturing a semiconductor device includes irradiating a region to be crystallized of a non-monocrystalline semiconductor film with laser beam modulated by an optical modulator to have light intensity distribution having a minimum light intensity line or minimum light intensity spot to crystallize the region, and heating the crystallized region by irradiating light from a flash lamp onto the crystallized region.

5 Claims, 11 Drawing Sheets

METHOD OF MANUFACTURING SEMICONDUCTOR DEVICE

CROSS-REFERENCE TO RELATED APPLICATIONS

This application is based upon and claims the benefit of priority from prior Japanese Patent Application No. 2004-220448, filed Jul. 28, 2004, the entire contents of which are incorporated herein by reference.

BACKGROUND OF THE INVENTION

1. Field of the Invention

The present invention relates to a method of manufacturing a semiconductor device, and more particularly to a method of manufacturing a semiconductor device, including crystallizing at least part of a non-monocrystalline semiconductor thin film.

Generally, even a single crystal involves disturbance of atomic rows (such as dislocation), and it is difficult to distinguish "single crystal" from "crystal close to single crystal," and thus, it should be noted in this specification that "crystal close to single crystal" is also described as "single crystal."

2. Description of the Related Art

The SOI (silicon on insulator) technology for forming a monocrystalline silicon on an insulating material substrate or on an insulating film is known as technology for realizing ULSI (ultra large-scale integrated circuit) integration, low power consumption, and high speed. This technology is classified into (1) a method of forming a single crystal thin film on an insulating film formed on a single crystal semiconductor wafer, for example, a silicon wafer, and (2) a method of crystallizing or re-crystallizing a non-monocrystalline (amorphous or polycrystalline) semiconductor thin film, for example, a non-monocrystalline silicon thin film, formed on an insulating material substrate or an insulating film. In both methods, it is very important to enhance the degree of crystallinity of silicon. Preferably, a region for forming a transistor should be single crystal, the crystal plane orientation should be uniform, in particular, the surface should be (001) plane, and the crystal orientation in the current flowing direction should be (100) plane. Accordingly, the method (1) is widely employed, separation by implanted oxygen (SIMOX) using a monocrystalline silicon wafer or a wafer bonding.

On the other hand, the method (2) is not employed in today's silicon ULSI technology. However, since the substrate material used is not limited, the method (2) can be applied in various electronic elements or electronic devices if a single crystal semiconductor thin film, such as a single crystal silicon thin film, of high quality can be formed. Accordingly, it is earnestly demanded to improve the method (2).

In the 1980s, many studies have been conducted in an attempt to form monocrystalline silicon thin film having uniform plane orientation. Of these, zone melting technology by radio frequency induction heating is an important technology, and is known as a technology capable of forming a monocrystalline silicon rectangular region of which crystal orientation has (001) plane.

As reported by Akira Fukami and Yu Kobayashi in "Journal of Electronic Communications Society" (1986/9 vol. J69-C No. 9, pp. 1089-1095), in the zone melting method, first, a polycrystalline Si thin film is deposited on a quartz substrate by an atmospheric chemical vapor deposition (CVD) method, and the thin film is patterned to obtain a pattern in which a number of rectangular regions spaced from each other and arranged linearly are mutually linked by thin necks. Then, an elongated radio frequency induction heater is positioned at the backside of the quartz substrate to heat the linearly arranged rectangular regions sequentially to 1412° C. or more to melt the polycrystalline silicon placed in a position corresponding to the heater, forming molten silicon region. Next, the heater is moved in the array direction of the rectangular regions, whereby the polycrystalline silicons are sequentially melted, and the entire rectangular region is melted. Of the rectangular region, the portion heated by the heater and then cooled has been already monocrystallized, and the other portion is not crystallized. By changing the dimensions (length and width) of the necks, heat flow is changed locally, and the crystal orientation varies depending on the heat flow. By optimizing the length and width of the necks, a crystallized rectangular region having orientation of (001) plane can be formed.

Incidentally, the technology for forming a crystallized silicon thin film on a glass or plastic substrate is applied in a technology for enhancing the performance of a thin film transistor used in a driving element of a liquid crystal display or the like. For example, when a semiconductor layer of the thin film transistor is changed from an amorphous structure to a polycrystalline structure, the mobility of the transistor becomes 100 times or higher.

In this case, however, at the time of crystallization, due attention must be paid to thermal damage on the substrate (for example, heating temperature for crystallization must be 600° C. or less in a general glass substrate, or 150° C. or less in plastics).

In the zone melting method using the radio frequency induction heating, the substrate (quartz substrate) is partly heated to temperature exceeding a melting point of silicon (1410° C.), and therefore, it cannot be applied in the field of liquid crystal display, in which the substrate is formed of a low melting point material such as glass or plastics.

To align the crystallized film in (001) plane orientation, it is required to optimize the shape of the necks connecting the rectangular silicon regions, which limits layout of transistors and circuits to be formed later.

Accordingly, as a method of crystallizing an amorphous silicon thin film without thermally damaging a substrate, an excimer laser crystallization method has been developed. In this technology, excimer laser beam is adjusted by a homogenizing optical system so that the intensity is uniform on the section, and the beam is shaped into a rectangular form (for example, a sectional shape of 150 mm×200 μm) through a metal mask having an opening of elongated rectangular shape. With this shaped laser beam, a surface of an amorphous silicon thin film deposited on a glass substrate is scanned at right angle to the longer side direction of the rectangle, and irradiated with laser in the shorter side direction at intervals of 10 μm. The silicon thin film having absorbed the laser beam is melted, and cooled to be polycrystalline silicon. In this technology, the substrate is not damaged thermally even if a general glass or plastic substrate is used. This is because the excimer laser is a pulse laser having a pulse width of about 20 ns, and the crystallization is complete in about 50 to 100 ns. The obtained crystal grain size depends on the laser energy density, and a polycrystalline thin film formed of crystal grains having grain size of about 0.1 to 1 μm can be formed. As for the plane orientation, it is reported that crystal grains formed by single laser irradiation are not aligned, but that, when laser irradiation is repeated hundreds of times, the surface orientation is aligned to (001) plane or (111) plane (as for the former, see, for example, D. P. Gosain, A. Machida, T. Fujino, Y. Hitsuda, K. Nakano and J. Sato, "Formation of (100)-Textured Si Film Using an Excimer Laser on a Glass Substrate," Jpn. J. Appl. Phys., Vol. 42 (2003), pp. L135-L.137; as for the latter, see, for example, H. Kuriyama, et al., "Enlargement of Poly-Si Film Grain Size by Excimer Laser Annealing and Its Application to High-Performance Poly-Si Thin Film Transistor," Jpn. J. Appl. Phys., Vol. 30 (1991), pp. 3700-3703).

However, in the excimer laser crystallization method, the crystallinity in the individual crystal grains may be made monocrystalline, but the thin film as a whole is polycrystalline. Therefore, when multiple transistors are formed, grain boundaries are present in the channel regions, so that the mobility is lowered, and the performances (threshold voltage, sub-shred coefficient, mobility) fluctuate among transistors. To increase the crystal grain size, the laser fluence (energy density) must be set at a level as closer as possible to the critical fluence at which the silicon thin film is totally melted. However, when the laser fluence exceeds the total melting condition, the silicon thin film becomes very fine crystals, which is not preferred. In other words, tolerance of the laser fluence to fluctuations is narrow. Since the crystal grain size is about 1 to 2 μm at maximum, there occurs limitation that the transistor size must be controlled smaller. For example, when a large area substrate for display of about 1 m×1 m is used, an extremely advanced fine processing technology is required. Besides, to align the surface orientation to (001), the laser must be irradiated 200 times or more (or for (111) plane, about 10 times). Hence, a very long processing time is required for crystallization. Even if the orientation of the surfaces of individual crystal grains, which provide the upper side (one face) of the crystallized film, is aligned uniformly at (001), the configuration is a disorderly rotation about the surface axis, and the crystal orientation of the section of the thin film is not aligned. That is, the plane orthogonal to the surface of the crystallized film cannot be oriented to (001) orientation.

Further, crystallization using a flash lamp alone instead of the excimer laser has been attempted. However, when multiple transistors are formed, however, grain boundaries are formed in the channel regions, so that the mobility is lowered, and the performances (threshold voltage, sub-shred coefficient, mobility) fluctuate among transistors, though the crystallinity within the crystal grains can be made monocrystalline as in the case of the excimer laser crystallization method.

Figure 12A:
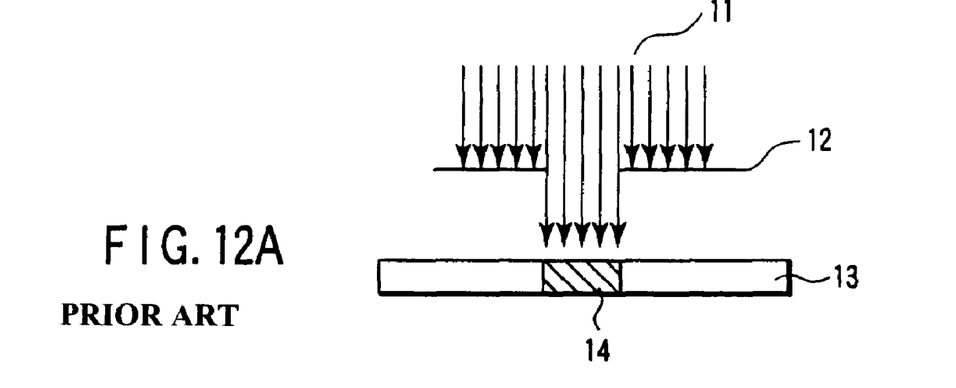
FIGS. 12A to 12D are explanatory diagrams for explaining an SLS method of a prior art.
Figure 12B:
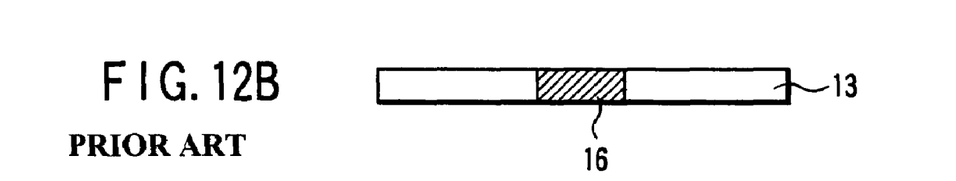
Figure 12C:
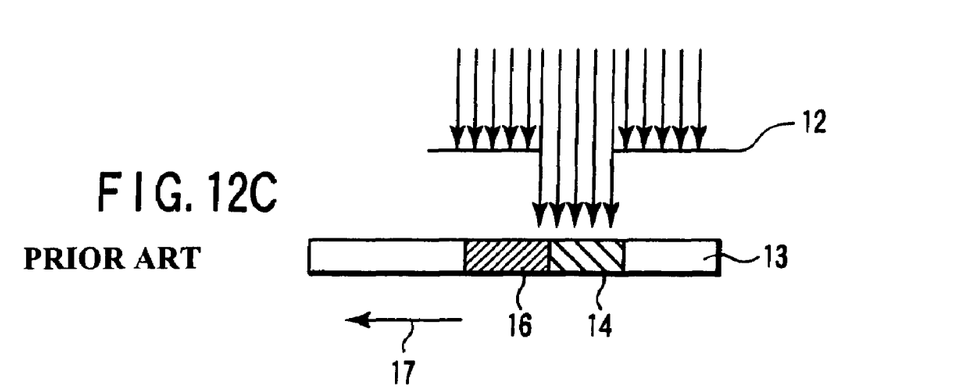
Figure 12D:
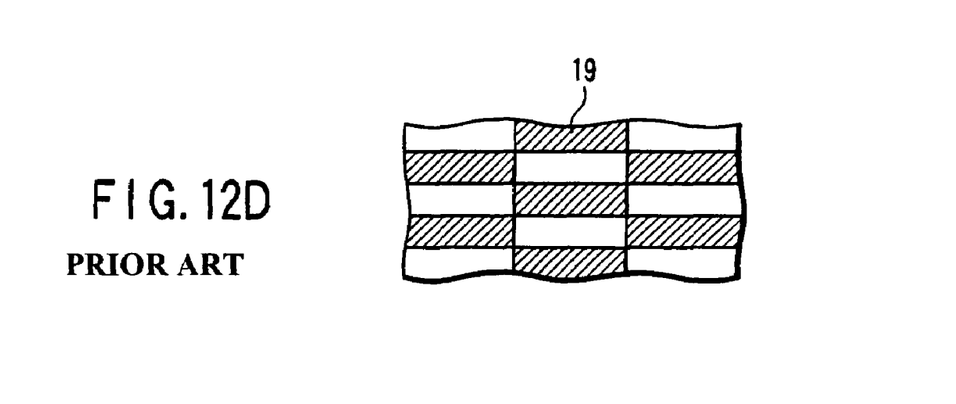

As a technology developed through the excimer laser crystallization technique, a technology called sequential lateral solidification (SLS) is also known. This technology is disclosed in, for example, Japanese Patent No. 3204986. In this technology, as shown in FIG. 12A, an excimer laser beam 11 homogenized in light intensity by the homogenizing optical system is passed through a metal mask 12 having a thin gap of about 2 μm to be shaped into a rectangular shape in section. When the fluence (energy density) of the laser having passed through the gap is set such that an amorphous silicon thin film 13 becomes a molten silicon 14 totally melted in the thickness direction, a lateral growth occurs from the outside region of the gap toward the inside, and a crystallized silicon 16 is formed (FIG. 12B). Next, the target structure is moved to the left direction by 2 μm as indicated by an arrow 17, and laser is emitted. Then, the molten silicon 14 grows in the lateral direction, starting from the seed crystal at the right end of the crystallized silicon 16 formed by the previous laser irradiation (FIG. 12C). By repeating this process of laser irradiation and target moving, a polycrystalline silicon thin film of large grain size can be formed. In this case, the plane shape of the mask 12 is made in a checkered pattern mask 19 as in FIG. 12D. In this case, when laser irradiation is repeated, the processing time is improved, and the overlaying region of crystallization is enhanced, so that a uniform laterally grown polycrystalline thin film is formed on the substrate surface.

However, since, in the SLS method, nearly half of the laser beam is shielded by the metal mask, the laser energy cannot be utilized effectively. As a result, it takes a longer time in processing for crystallization. Besides, since the positions of the crystal grains are scattered, the performance fluctuates among transistors as in the case of the excimer laser crystallization. Hence, the plane orientation of the crystal grains is not uniform, which also leads to fluctuation of performance among transistors.

Figure 13A:
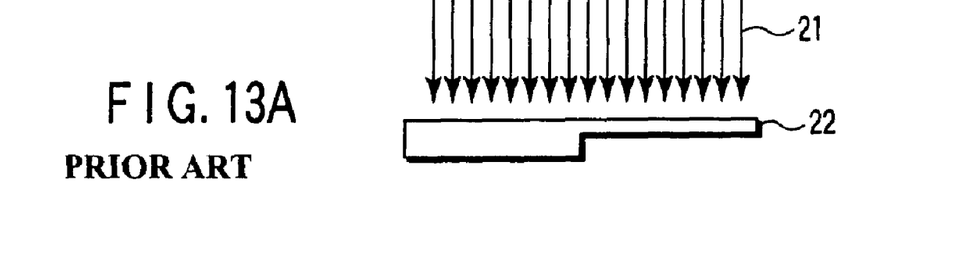
FIGS. 13A to 13D are explanatory diagrams for explaining a phase modulated excimer laser crystallization method of a prior art.
Figure 13B:
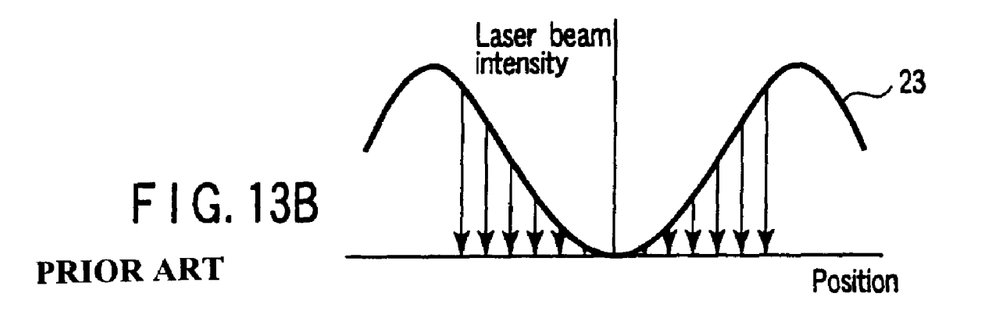
Figure 13C:
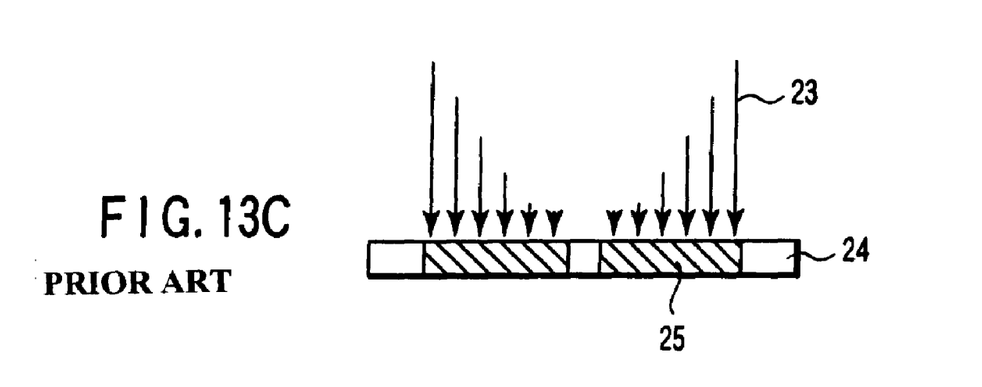

As a technology further developed through the excimer laser crystallization method, a phase-modulated excimer laser crystallization method is also known (see, for example, Masakiyo Matsumura, "Surface Science," Vol. 21, No. 5, pp. 278-287, 2000). This method is featured in that, as shown in FIG. 13A, excimer laser beam 21 is passed through an optical component called a phase shifter 22 (for example, a quartz plate processed by forming steps), and therefore, the laser beam intensity distribution is modulated in space as indicated by reference numeral 23 in FIG. 13B. An amorphous silicon thin film 24 is irradiated once by using the thus modulated laser beam, and the irradiated region 25 is crystallized as shown in FIG. 13C.

Figure 13D:
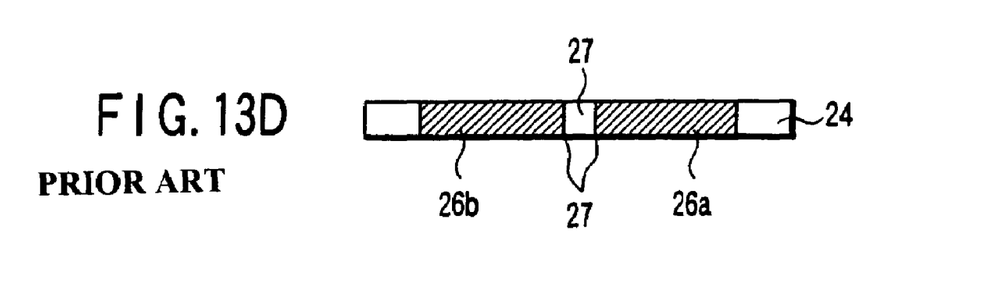

This method, different from the excimer laser crystallization method or SLS method, does not use a uniform light intensity distribution, and does not require multiple times of laser irradiation. In this method, the modulated light intensity distribution 23 provides an inclined temperature distribution in the thin film irradiated with the laser, and a crystal nucleus is formed at the position 27 of small energy, so that the position of crystal nucleus can be accurately determined. Moreover, as shown in FIG. 13D, crystal grains 26a, 26a of large grain size can be obtained by lateral growth from the crystal nucleus. By this method, crystal grains of large grain size are formed, and the position of crystal nucleus can be also controlled.

However, in the phase modulated excimer laser crystallization technology, crystal grains of large grain size are obtained, but it has been further demanded to form larger crystal grains so as to fabricate a plurality of transistors in one crystal grain, and to relax the restriction on the circuit layout.

BRIEF SUMMARY OF THE INVENTION

It is therefore an object of the invention to provide a method of manufacturing a semiconductor device capable of forming a semiconductor crystal thin film having a larger grain size on an underlying insulating layer.

According to a first aspect of the present invention, there is provided a method of manufacturing a semiconductor device, comprising: a laser irradiating step of irradiating a region to be crystallized of a non-monocrystalline semiconductor film with laser beam modulated by an optical modulator to have light intensity distribution having a minimum light intensity line or minimum light intensity spot to crystallize the region; and a heating step of heating the crystallized region by irradiating light from a flash lamp onto the crystallized region.

According to a second aspect of the present invention, there is provided a method of manufacturing a semiconductor device, comprising: a laser irradiating step of irradiating a region to be crystallized of a non-monocrystalline semiconductor film with laser beam modulated by an optical modulator to have light intensity distribution having a minimum light intensity line or minimum light intensity spot to form a plurality of main crystal grains and fine crystal grains around them; and a heating step of heating by irradiation of light from a flash lamp to monocrystallize the region to be crystallized by incorporating the fine crystal grains into the main crystal grains.

According to a third aspect of the present invention, there is provided a method of manufacturing a semiconductor device, comprising: a laser irradiating step of irradiating a target having a non-monocrystalline semiconductor film formed thereon, with pulse laser beam having energy sufficient to melt the non-monocrystalline semiconductor film, thereby crystallizing at least a portion of the non-monocrystalline semiconductor film, and a heating step of irradiating the non-monocrystalline including the crystallized portion with light from a flash lamp having energy sufficient to melt the non-monocrystalline semiconductor film, thereby monocrystallizing at least the crystallized portion.

In the present invention, the laser irradiating step may include a step of forming crystal grains whose plane orientation in a direction of crystal growth is a predetermined plane and which grow faster than other crystal grains; and the heating step may include a step of growing, using the crystal grains as crystal nucleus, crystal grains whose plane orientation in a direction of crystal growth is the predetermined plane, in the semiconductor thin film.

Also in the present invention, the laser irradiation step may include a step of forming crystal grains which have triangular shape when viewed from one side, and whose plane orientation in a direction of crystal growth is (100) plane, and the heating step may include a step of growing, using the triangular crystal grains as crystal nucleus, crystal grains which have nearly rectangular surface shape as viewed from one side, and whose plane orientation in a direction of crystal growth is (100) plane, in the semiconductor thin film.

Usually, in the laser irradiation step, the laser beam of light intensity distribution having the minimum light intensity line or minimum light intensity spot is formed by the optical modulator.

Further, in the present invention, the optical modulator may have a phase shifter which outputs the laser beam of light intensity distribution having a minimum light intensity line or minimum light intensity spot by modulating a phase of incident laser beam.

DETAILED DESCRIPTION OF THE INVENTION

First, a basic concept of the present invention will be explained.

Figure 1:
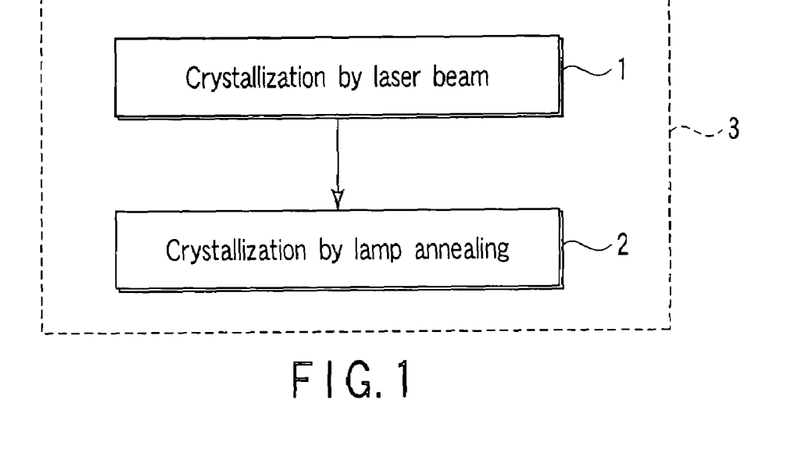
FIG. 1 is a flowchart of a method of manufacturing a semiconductor device showing a basic concept of the invention.
Figure 2:
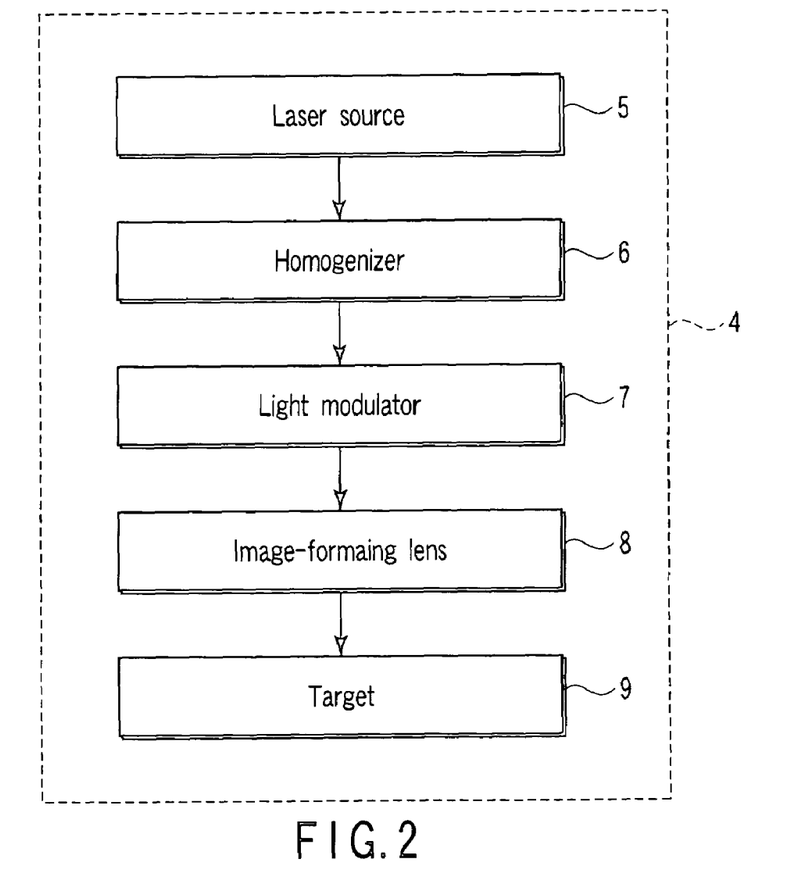
FIG. 2 is a diagram showing an optical system from a laser source to a target along an optical path according to the invention.

FIG. 1 is a flowchart of a method of manufacturing a semiconductor device showing a basic concept of the invention. FIG. 2 is a diagram showing an optical system from a laser source to a target along an optical path according to the invention.

First, a method 3 of manufacturing a semiconductor device according to the present invention includes irradiating a region to be crystallized of a non-monocrystalline semiconductor thin film with laser beam, which is light-modulated by a light modulator to have light intensity distribution having the minimum light intensity line or minimum light intensity spot, to crystallize the irradiated region (step 1). Then, the crystallized region is irradiated with light from a flash lamp to heat the crystallized region (step 2).

Figure 3:
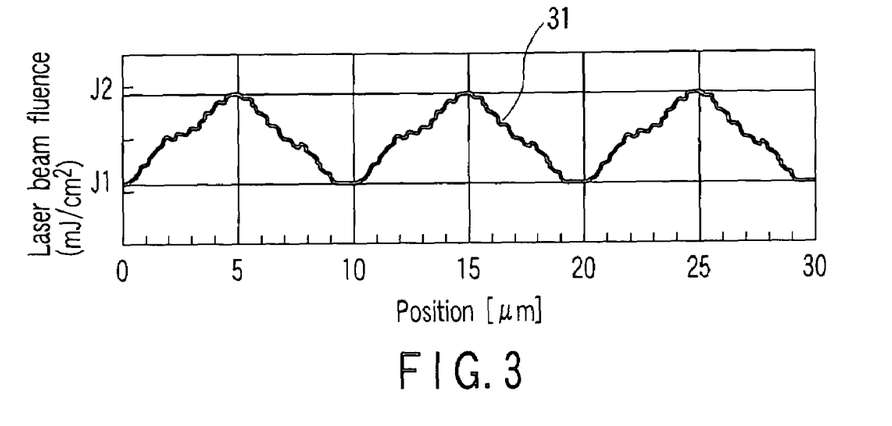
FIG. 3 is a view of light intensity distribution of laser beam for explaining one embodiment of the invention.
Figure 11A:
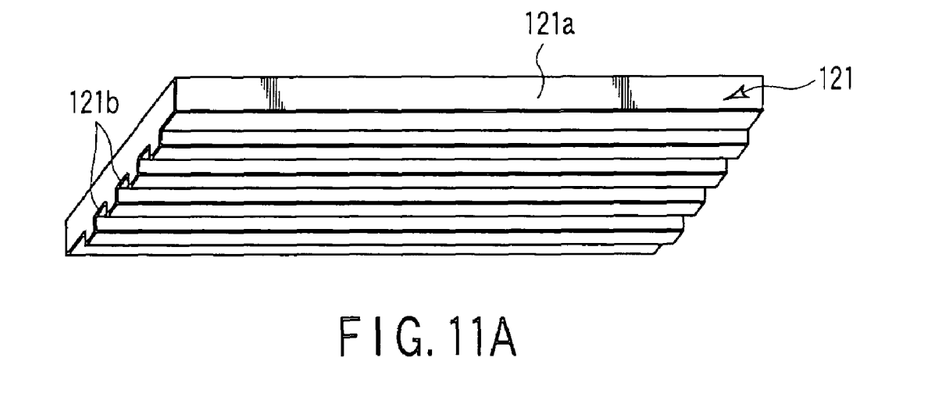
FIG. 11A is a perspective view of a phase shifter for annealing.

In step 1, by using a phase shifter 121 made of a quartz substrate of which surface is processed in linear steps as a light modulator as shown in FIG. 11A, laser beam from the light source is modulated to have laser beam intensity distribution 31 changing in a triangular shape between the minimum light intensity J1 and the maximum light intensity J2 as shown in FIG. 3. The so modulated laser beam irradiates a target thin film to be crystallized (for example, an amorphous silicon thin film) to effect crystallization (in this case, to form polycrystalline silicon). In this specification, a region desired to be finally crystallized is called a "region to be crystallized".

The surface morphology of the crystal grains of the crystallized thin film and crystallographic orientation of individual crystal grains were measured by a scanning electron microscope (SEM) method and an electron back scattering diffraction (EBSD) method. As a result, it has been found that the crystal grains could be classified into three types, that is, small diameter crystal grains, strip shaped crystal grains, and triangular crystal grains (to be specifically described later by referring to FIG. 4A). The triangular crystal grain means a crystal grain which is grown in lateral direction starting from the minimum light intensity line or minimum light intensity spot of laser beam irradiation, and which is to be formed into a crystal seed in a next step. Not limited to a perfect triangular shape, it may include, for example, a polygonal shape or an arc shape in part. Many crystal grains are formed in a triangular shape, and they are called triangular crystal grains.

Here, it has been found that the growth distance of the triangular crystal grain is long, and the plane orientation of the crystal growth direction is (100) plane, and that the vertical direction in plane of the thin film out of two vertical directions to the crystal growth direction is (010) plane or (011) plane.

Figure 5A:
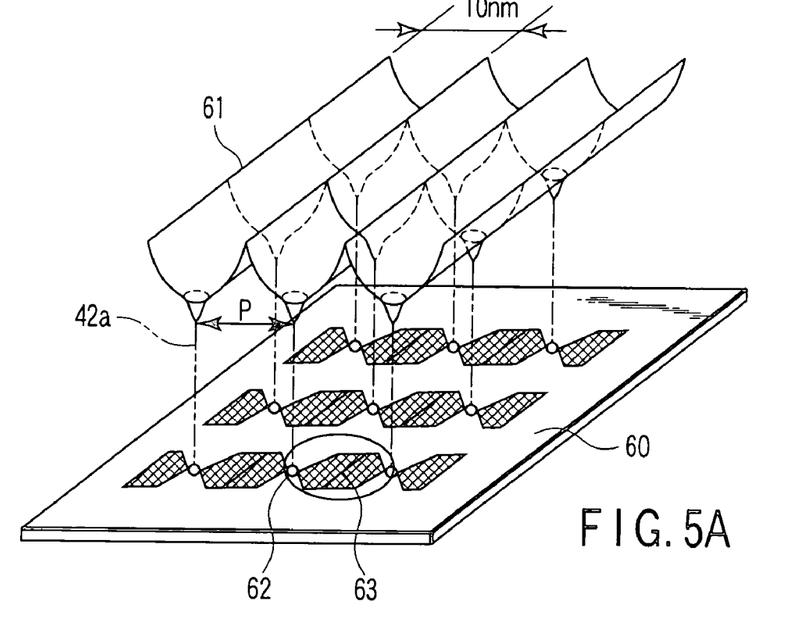
FIG. 5A is a perspective view schematically showing laser irradiation having light intensity distribution of a triangular reverse peak pattern.
Figure 5B:
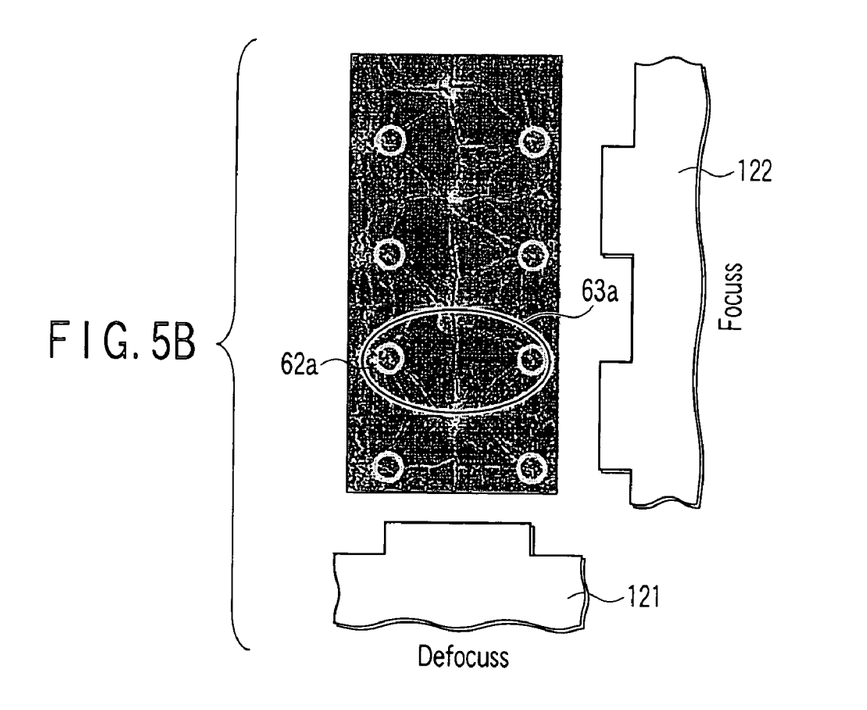
FIG. 5B is a view showing the relation between a phase shifter after laser irradiation and crystal grains controlled in position in two dimensions.

Further, a non-crystallized film 60 can be irradiated with phase modulated excimer laser having laser beam intensity distribution 61 shown in FIG. 5A. The laser beam intensity distribution 61 has the minimum light intensity line with constant pitch P by using a phase shifter 121 shown in FIG. 11A, or the minimum light intensity spot with constant pitch P by using phase shifters 121 and 122 shown in FIGS. 11A and 11B, for example, plural minimum light intensity spots (reverse peak spots) 42a of 10 μm. In FIG. 5A, the crystallization start point is indicated by reference numeral 62, and crystallization end position is indicated by reference numeral 63. Thus, two-dimensionally position-controlled crystals as shown in FIG. 5B are obtained as described later. The pitch P refers to the step between the thin groove formed in the surface and the surface, that is, the interval between phase shift lines, as later explained by referring to FIGS. 11A to 11D.

That is, in order to produce a crystallized film whose surface morphologically quadrangular crystals are one-dimensionally position-controlled and whose plane orientation at least in the growth direction is (100), one-dimensional laser beam intensity distribution may be formed by using a one-dimensional phase shifter 121 as shown in FIG. 11A, and the amorphous silicon thin film surface may be irradiated with the resultant laser beam to form crystal grains grown in one direction. In this case, the light intensity distribution of the laser beam to be used is designed such that the start position and end position of crystal growth has the minimum value J1 (start position) and the maximum value J2 (end position) of laser beam intensity, for example, energy light of 900 mJ/cm$^2$. By periodic annealing by such laser irradiation, crystal grains grown in the lateral direction are formed in the entire irradiated region of the amorphous silicon thin film.

A laser beam crystallization apparatus 4 is configured as shown, for example, in FIG. 2. A homogenizer 6 is provided in the laser optical path from the laser source 5, and the light intensity distribution of the laser beam is homogenized. A light modulator 7 is provided in the optical path of the laser thus homogenized, and this light modulator 7 modulates the homogenized laser beam to have light intensity distribution of reverse peak shape. An image-focusing lens 8 is provided in the optical path of the laser beam having passed the modulator 7 to focus the image on the target 9. The crystallization apparatus 4 is so constructed. By the crystallization apparatus 4, the crystallization step 1 by laser beam is finished.

Next, a crystallization step 2 by lamp annealing is carried out. In this step, crystallization by irradiation with xenon flash lamp used as a light source to obtain crystals of large grain was conducted.

Figure 10:
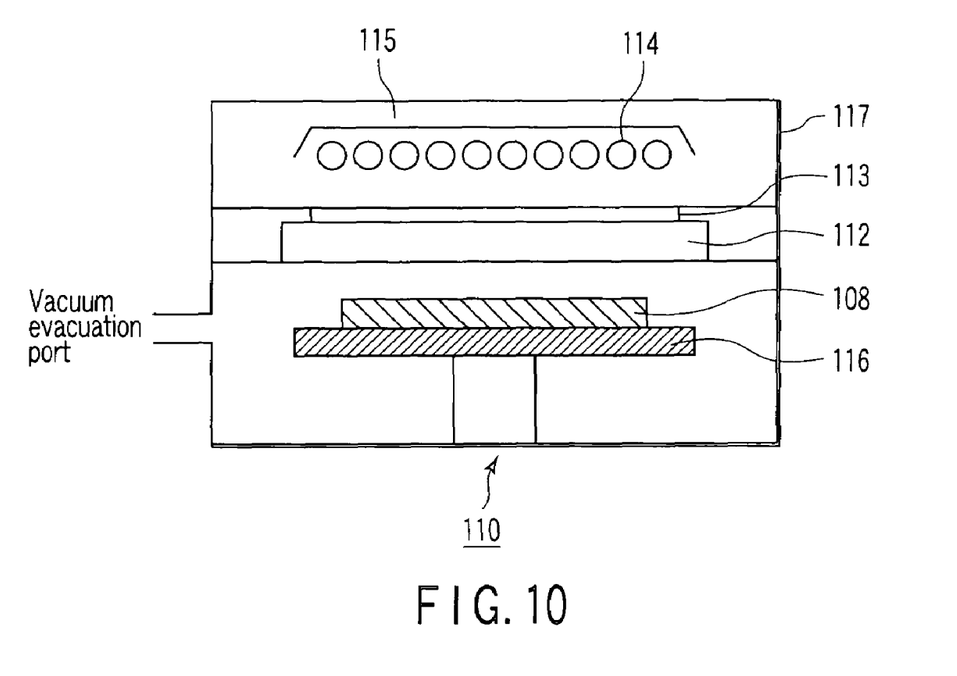
FIG. 10 is a schematic diagram of a flash lamp heating apparatus usable in the invention.

The flash lamp heating step can be carried out by using a flash lamp heating device 110 as shown in FIG. 10. The heating device 110 comprises a plurality of bar-shaped xenon flash lamps 114 oppositely to a target 108 disposed in a chamber 117. Above the xenon flash lamps 114, a reflector 115 is disposed for reflecting the upwardly emitted lamp beams toward the target 108. The light from the xenon flash lamps 114 is irradiated onto the target 108 through a light-transmitting plate 112 such as quartz, capable of transmitting light of ultraviolet rays to visible region. To enhance the uniformity of heating, a light diffuser 113 may be placed in the incident optical path to the target 108. Further, a plate 116 for supporting the target 108 may be provided with heating means for preheating (for example, 250 to 550° C.). The xenon flash lamp 114 is a glass tube sealing xenon gas therein, with an anode and cathode, connected to capacitors, disposed at both ends thereof. The current accumulated in the capacitors of a driving power source circuit flows into the glass tube, and the xenon gas is heated by Joule heat at this time to emit light. In this xenon flash lamp, since the previously accumulated electrostatic energy is converted into short light pulses of 0.1 ms to 10 ms, a very intense light can be emitted as compared with the light source of continuous lighting type. The pulse width of the flash lamp is preferably 0.5 to 2 ms. The flash lamp is high in controllability, and usually one flash process is enough. By a single irradiation, thermal damage of the semiconductor substrate can be minimized, and the throughput is enhanced at the same time. However, the lamp annealing may be carried out 2 or more times in order to enhance the crystallinity. The emission spectral characteristic of the xenon flash lamp is desired to have a strong intensity from ultraviolet ray with high absorption coefficient of silicon film to a visible region by controlling voltage, current density, gas pressure and lamp inside diameter. Specifically, as found in the experiment, the condition range for obtaining an effective ultraviolet emission intensity for monocrystallization of silicon was current density of 3000 A/cm$^2$ to 10000 A/cm$^2$. As particular conditions, the voltage was 3.5 kV, current density was 4200 A/cm$^2$, and gas pressure was 400 Torr (5.3×10$^4$ Pa). A high current density is preferred because the plasma temperature increases and the ratio of energy density of the short wavelength components becomes higher.

The heating step is preferably conducted in vacuum or inert gas atmosphere. But, the invention is not limited by such technique.

Figure 4A:
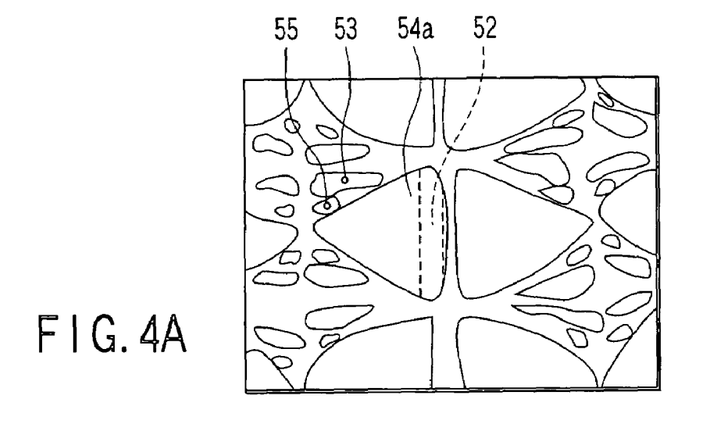
FIG. 4A is a view showing a thin film surface after phase modulated excimer laser irradiation.
Figure 4B:
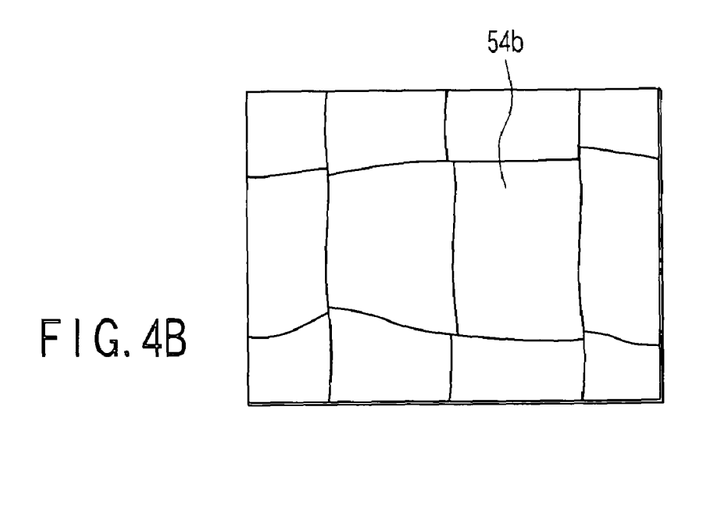
FIG. 4B is a view showing a crystallized thin film surface after flash lamp irradiation.

The crystallized thin film surfaces before and after irradiation by the xenon flash lamps are shown in FIGS. 4A and 4B, respectively. FIGS. 4A and 4B are drawn by tracing scanning electron microscope images of the crystallized thin film surfaces before and after irradiation by the xenon flash lamps. With the xenon flash lamp irradiation, a bottom region 52 of the triangular crystal grains formed by the laser irradiation acts as seed crystals, and a small diameter crystal grain 55 and a strip shape crystal grain 53 formed by the laser irradiation are melted again and incorporated into the crystals grown from the seed crystals. Therefore, by xenon flash lamp irradiation, crystal grains 54b of quadrangular surface morphology are formed (FIG. 4B). The crystallized crystal grains 54b are square, and the crystallinity was as excellent as that of single crystals. For forming crystal nucleus with their positions controlled, the phase modulated laser irradiation is necessary, but the spatially modulated laser beam is not always necessary for secondary expansion of crystal grains. Accordingly, the heating by xenon flash lamps, which are capable of emitting uniform beams, is advantageous because of its superior controllability, uniformity, throughput, maintainability and productivity, and also of low cost of equipment. The pulse width of the xenon flash lamp is short as mentioned above, and the pulse width and emission spectral characteristic may be controlled to a certain extent, so that it is easier to optimize the temperature increase of the silicon film in consideration of effects on the underlying substrate.

Namely, the region crystallized by the irradiation with the laser beam is a region depending on the diameter of the laser beam. Therefore, the region to be irradiated must be moved in order to effect a wide crystallization. By contrast, the flash lamp irradiation covers a wide region, and can effect a wide range of crystallization.

Various embodiments of the invention based on the basic concept described above will now be described below with reference to the accompanying drawings.

Figure 6A:
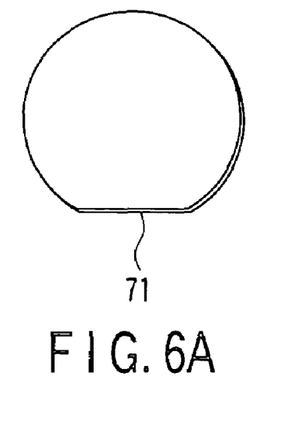
FIGS. 6A to 6C are plan views showing three examples of a circular substrate having an orientation indication index for formed thereon.
Figure 6B:
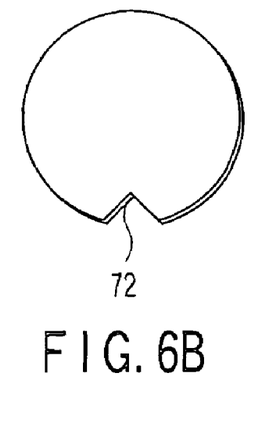
Figure 6C:
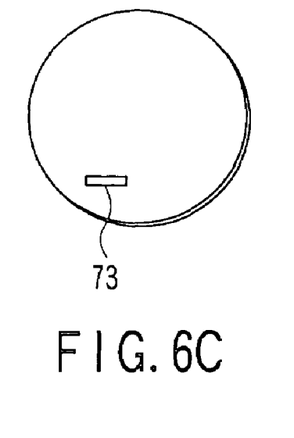

First, an embodiment of a method of manufacturing a semiconductor device having an array of quadrangular crystallized regions having uniform plane orientation formed on a circular substrate (indicated by reference numeral 81 in FIG. 7) having orientation indication index such as an orientation flat 71, a notch 72, and a substrate mark 73 shown in FIGS. 6A to 6C will be described with reference to FIGS. 3, 4A, 4B, 5A, 5B, 6A to 6C, and 7A to 7D, in particular FIGS. 7A to 7D.

Figure 7A:
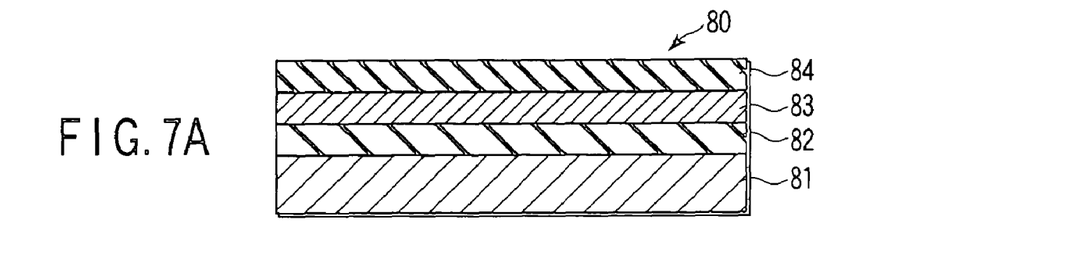
FIGS. 7A to 7D are views for explaining a first embodiment of a crystallization method of the invention in the sequence of steps.

First, a semiconductor structure having a semiconductor thin film to be crystallized (also called target) 80 is prepared. As shown in FIG. 7A, the semiconductor structure 80 has a semiconductor substrate 81 (for example, a semiconductor wafer of Si, Ge, $Si_{1-x}Ge_x$, $Si_{1-x-y}Ge_xC_y$, GaAs, GaP, InAs, GaN, ZnTe, CdSe, CdTe, etc.), and an insulating layer 82 (for example, film thickness 500 nm) is formed on the semiconductor substrate 81. The insulating layer 82 is, for example, a $SiO_2$ film formed by thermal oxidation, or CVD (for example, plasma CVD or low pressure CVD) or a sputtering method. Alternatively, the insulating layer 82 may be a laminated structure of, for example, a SiN film and a $SiO_2$ film. It may be a SOG (spin on glass), or may be of a laminated structure of SOG with a SiN film and/or a $SiO_2$ film. The insulating layer 82 prevents contamination from the substrate, prevents diffusion, and also acts to promote growth of larger crystals since the semiconductor thin film 83 is cooled slowly after the heating step by the laser or xenon flash lamps because of the heat accumulation effect brought about by the heat-insulating property of the insulating layer. The insulating layer 82 is formed on the entire surface of the semiconductor substrate 81. The insulating layer may be used entirely as it is, or partly removed by patterning. Here, the explanation will be given for the case where the insulating layer is used in the following steps as it is formed on the entire surface of the semiconductor substrate 81. On the insulating layer 82, that is, on one side of the semiconductor substrate 81, an amorphous or polycrystalline semiconductor thin film 83 (for example, Si, $Si_{1-x}Ge_x$, or $Si_{1-x-y}Ge_xC_y$ film having a thickness of about 30 to 200 nm) is formed by CVD (plasma CVD or low pressure CVD, etc.) or sputtering method. The semiconductor thin film 83 may be formed on the entire surface of the insulating layer 82, or on partial regions of the insulating layer by patterning. Here, it is formed on the entire surface of the insulating layer 82. On the entire surface of the semiconductor thin film 83, a protective film 84 (for example, $SiO_2$, SiON, SiN, SOG, or their laminated film) is formed to have a thickness of 40 to 500 nm, for example, about 300 nm. The protective film 84 prevents contamination from the outside, prevents contamination of particles, and also acts to grow larger crystals since the semiconductor thin film 83 is cooled slowly after the heating step by the laser or xenon flash lamps because of the heat accumulation effect brought about by the heat-insulating property of the insulating layer. When the insulating layer 82 and semiconductor thin film 83 are patterned, the protective film may be formed on the entire surface of the substrate.

Figure 7B:
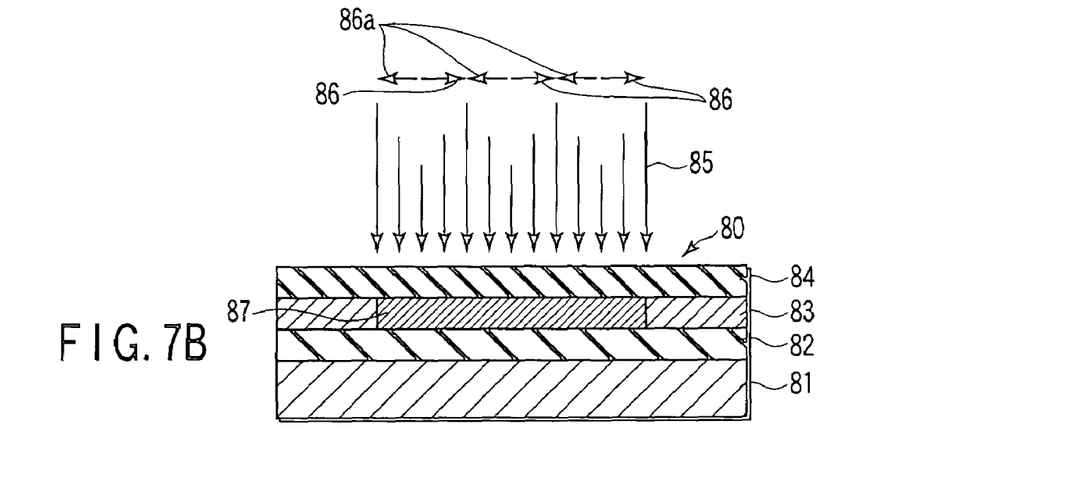

Next, as shown in FIG. 7B, with alignment to a predetermined position on the surface of the protective film 84, the excimer pulse laser beam 85 having laser beam intensity distribution 61 as shown in FIG. 5A is irradiated according to the phase modulated excimer laser crystallization method. In this phase modulated excimer laser crystallization method, use is made of the laser crystallization apparatus shown in FIGS. 9A to 9C which will be described later in detail. In such laser beam irradiation, the irradiation position is determined by the mark preliminarily provided on the substrate or semiconductor wafer.

In this laser irradiation, the light intensity distribution having plural reverse peaks is used in a single irradiation of pulsed laser beam, but three reverse peaks are shown in FIG. 7B for simplicity purpose. This light intensity distribution includes a pair of main gradient directions (direction of light intensity becoming stronger almost linearly from the minimum light intensity spot) 86 and/or 86a, with each reverse peak (minimum light intensity spot) taken as the center. The pair of main gradient directions 86 and 86a is in the relation of mutual rotation of 180 degrees in the drawing sheet. In order that the main gradient direction 86 or 86a and orientation indication index of the semiconductor substrate 81 have a predetermined relation, the semiconductor substrate 81 and a light modulator, for example, a phase shifter are preliminarily set. Here, the main gradient direction 86 is set to be parallel to the orientation flat 71.

In this laser irradiation, the energy density of the laser is preferably such that, as shown in FIG. 3, the minimum value of light intensity exceeds the critical value j1 of the lateral growth condition, and the maximum value of light intensity is not more than the evaporation critical value j2 of the semiconductor thin film 83. These critical values of j1 and j2 are mainly determined by the absorption coefficient for the laser light and the film thickness of the semiconductor thin film 83.

By the irradiation with the laser beam 85, the irradiated region of the semiconductor thin film 83 is melted, and when laser irradiation is cut off, the melted region is cooled. The melted region declines in temperature according to the light intensity distribution in FIG. 3, but by the heat accumulation function of the insulating film 82 and protective film 84, the temperature fall speed is largely lowered, and crystals are grown in the lateral direction from the minimum value j1 position to the maximum value j2 position. As a result, the irradiated region of the semiconductor thin film 83 is crystallized, and converted into a polycrystalline semiconductor thin film 87. The surface morphology of the polycrystalline semiconductor thin film 87 is crystallized in the lateral direction along the main gradient directions 86, 86a. At this stage, when the protective film 84 was removed by etching, and the surface of the semiconductor thin film 83 was observed and analyzed by the scanning electron microscope method and electron back scattering diffraction method, the individual crystal grains were found to start crystal growth from the position at which the laser beam intensity is low (minimum value J1), and continue crystal growth along the main gradient directions 86, 86a. Each crystal grain is estimated to be grown from one crystal nucleus, and small diameter crystal grain, strip shape crystal grain, and triangular crystal grain were formed. Among them, the longest growth distance in the lateral direction was observed in the triangular crystal grain, and when the crystal orientation of individual crystal grains was analyzed by the electron back scattering diffraction method, the plane orientation in the growth direction of the triangular crystal grains (that is, the main gradient directions 86, 86a) was (100). The growth distance of the triangular crystal grain is at least 2 μm, and it was 5 μm in this embodiment. On the other hand, the crystal plane orientation in the main gradient direction of the small diameter crystal grain and strip shape crystal grain was (111) or (110) plane.

Figure 7C:
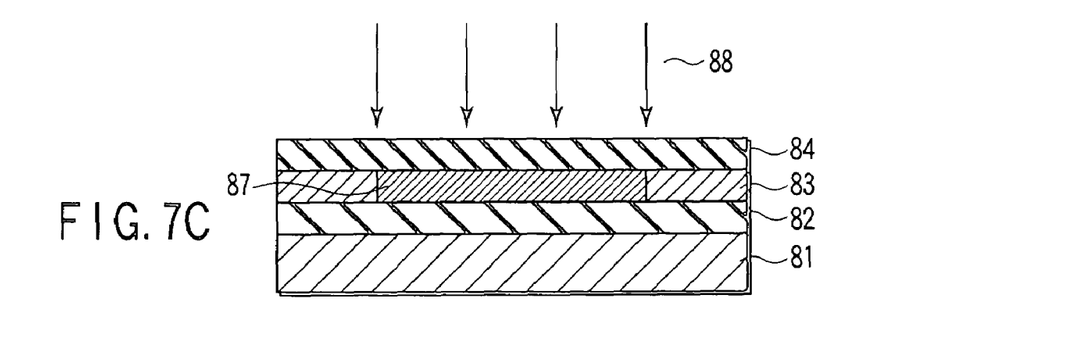
Figure 7D:
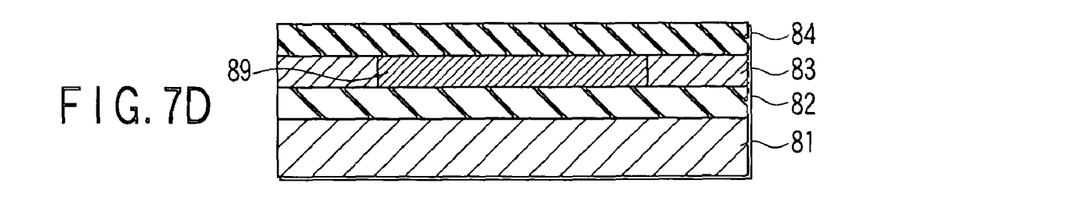

Next, as shown in FIG. 7C, without etching the protective film 84, flash lamp light 88 is irradiated onto the semiconductor thin film 83 including at least part of the crystallized region. That is, by turning on the flash lamp 88, the irradiated region of the semiconductor thin film 83 is heated and melted. In the temperature decreasing process after turning off the lamp, the irradiated region is crystallized. For example, before flash lamp heating, the small diameter crystal grain 55, strip shape crystal grain 53, and triangular crystal grain 54a are formed as shown in FIG. 4A. By flash lamp heating, the heated region of the crystallized region 87 of the semiconductor thin film 83 is converted into a semiconductor region 89 (see FIG. 7D) of large crystal grain size as in FIG. 4B.

The surface shape of the crystal grain 54b (shape of the semiconductor region 89 as viewed from above, that is, shape in horizontal plane) is nearly quadrangle (rectangle), and the plane orientation of the crystal grain in the main gradient directions 86, 86a of light intensity distribution is (100). The crystallinity of the crystallized region of the semiconductor region 89 is single crystal. In FIG. 4B, as mentioned above, the small diameter crystal grain, strip shape crystal grain, and triangular crystal grain observed in FIG. 4A are hardly present. This is because the triangular crystal grain 54a formed by the laser irradiation is not completely melted in flash lamp heating, and only the surface is activated or partly melted, while the small diameter crystal grain 55 and strip shape crystal grain 53 are completely re-melted. It is considered that the difference in absorption coefficient in the flash lamp wavelength region between monocrystalline silicon and polycrystalline silicon may be involved in these phenomena. It is hence considered that the crystallization is further promoted while maintaining the crystal orientation (100) by using the triangular crystal grain 54a as the seed crystal. The small diameter crystal grain 55 and strip shape crystal grain 53 having (111) plane or (110) plane in the main gradient direction are extinguished, and transformed into crystal grains oriented in (100) plane.

As can be understood from the explanation above, the plane orientation, in the direction along the orientation flat of the semiconductor substrate 81, of the crystal grain of the semiconductor region 89 formed in this embodiment is (100) plane.

Therefore, according to this embodiment, it is possible to form an array of monocrystallized regions having (100) plane orientation in one direction of section and composed of nearly quadrangular crystal grains. In the method explained so far, in the drawing, it seems that part of the semiconductor thin film 83 is monocrystallized, but by repeating the same process, the semiconductor thin film 83 may be entirely monocrystallized.

A second embodiment of the method of manufacturing a semiconductor device having quadrangular crystallized region array uniformly arranged in plane orientation on an insulating material substrate will be explained by referring to FIGS. 6D to 6F and 8A to 8D, particularly referring to FIGS. 8A to 8D.

Figure 6D:
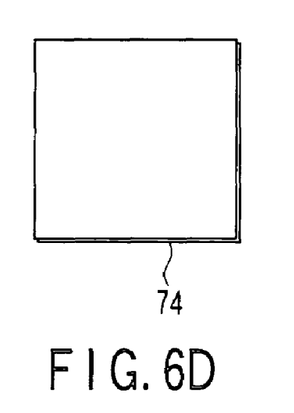
FIGS. 6D to 6F are plan views showing three examples of a rectangular substrate having an orientation indication index formed thereon.
Figure 6E:
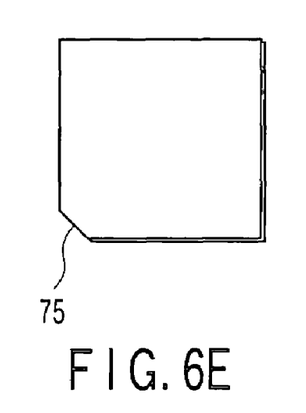
Figure 6F:
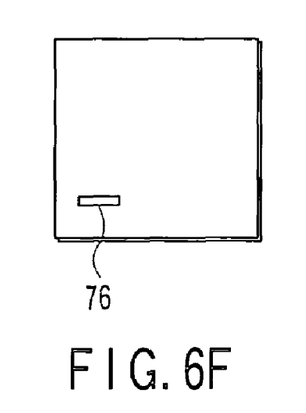
Figure 8A:
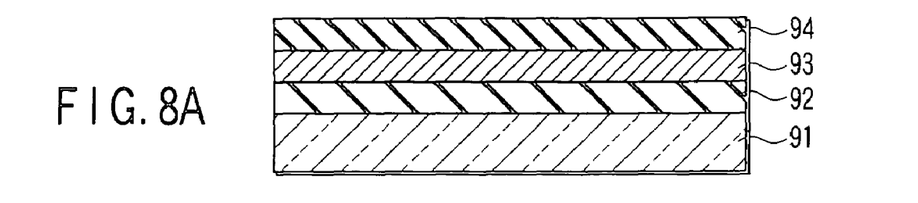
FIGS. 8A to 8D are views for explaining a second embodiment of the crystallization method of the invention in the sequence of steps.

First, an insulating material substrate 91 (for example, quartz glass, soda glass, borosilicate glass, lead glass, fluoride glass, sapphire, plastic, polyimide, etc.), having a side 74, a notch 75 or a marking 76 (may be on front surface or rear surface of the substrate) as shown in FIGS. 6D to 6F, is prepared (FIG. 8A). An insulating layer 92 (for example, film thickness 500 nm) is formed on this insulating material substrate 91. The insulating layer 92 is, for example, a $SiO_2$ film formed by CVD (for example, plasma CVD or low pressure CVD method) or sputtering method. Alternatively, the insulating layer 92 may be a laminated structure of different materials, for example, SiN and $SiO_2$. Further, it may be SOG, or of a laminated structure of SOG with a SiN film and/or a $SiO_2$ film. The insulating layer 92 prevents contamination from the substrate, prevents diffusion, and also acts to grow larger crystals since the semiconductor thin film is cooled slowly after the heating step by the laser or xenon flash lamps because of the heat accumulation effect brought about by the heat-insulating property of the insulating layer. The insulating layer 92 is formed on the entire surface of the semiconductor substrate 91, or in partial region of the insulating material substrate by patterning. Here, it is formed on the entire surface of the insulating material substrate 91. On the insulating layer 92, an amorphous or polycrystalline semiconductor thin film 93 (for example, Si, Ge, $Si_{1-x}Ge_x$, or $Si_{1-x-y}Ge_xC_y$ film having a thickness of about 30 to 200 nm) is formed by CVD (plasma CVD or low pressure CVD, etc.) or sputtering method. The semiconductor thin film 93 may be formed on the entire surface of the insulating layer 92, or partial region of the insulating layer 92 left over by patterning. Here, it is formed on the entire surface of the insulating layer 92.

Then, as shown in FIG. 8A, on the entire surface of the semiconductor thin film 93, a protective film 94 (for example, $SiO_2$, SiON, SiN, SOG, or their laminated film) is formed to a thickness of about 300 nm. The protective film 94 prevents contamination from the outside, prevents contamination by particles, and also acts to grow larger crystals since the semiconductor thin film is cooled slowly after the heating step by the laser or xenon flash lamps because of the heat accumulation effect brought about by the heat-insulating property of the protective layer When the insulating layer 92 and semiconductor thin film 93 are patterned, the protective film may be formed on the entire surface of the substrate. The subsequent process is substantially the same as in the first embodiment, and is described only briefly below.

Figure 8B:
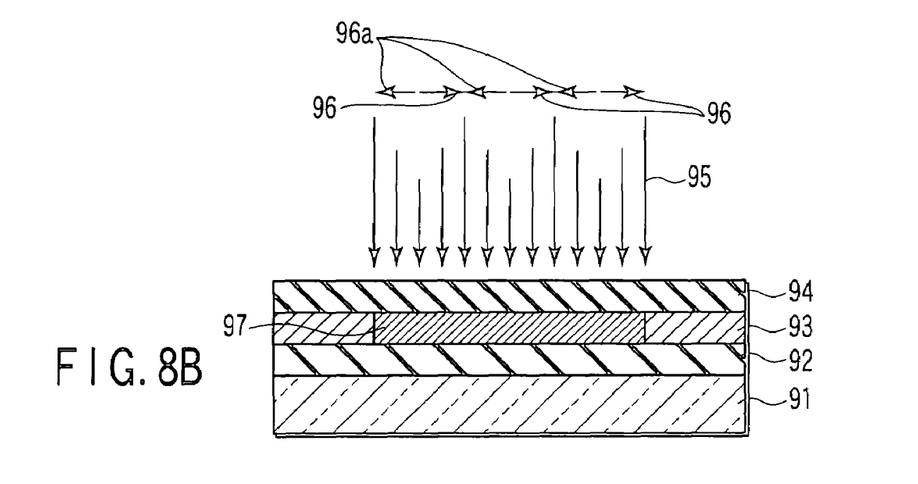

As shown in FIG. 8B, the surface of the protective film 94 is irradiated with laser beam 95 having light intensity distribution as mentioned above. The main gradient directions 96, 96a of light intensity in this laser irradiation are set on the basis of the orientation indication index marked on the insulating material substrate 91. In this embodiment, the main gradient directions 96, 96a coincide with the direction indicated by the orientation indication index. By this laser irradiation, the irradiated region of the semiconductor thin film 93 is transformed into a crystallized semiconductor thin film 97.

Figure 8C:
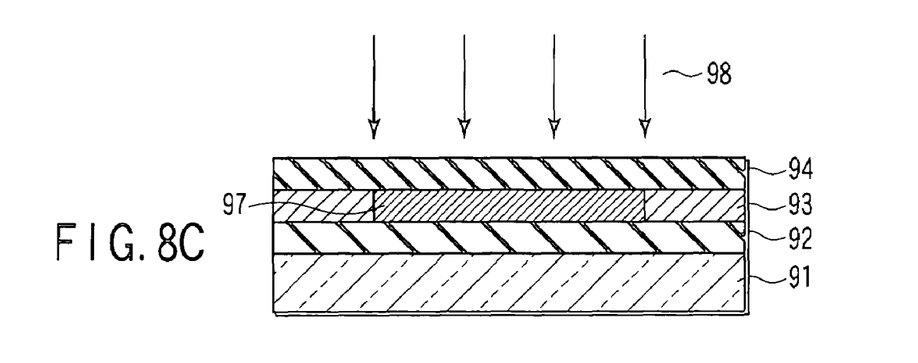
Figure 8D:
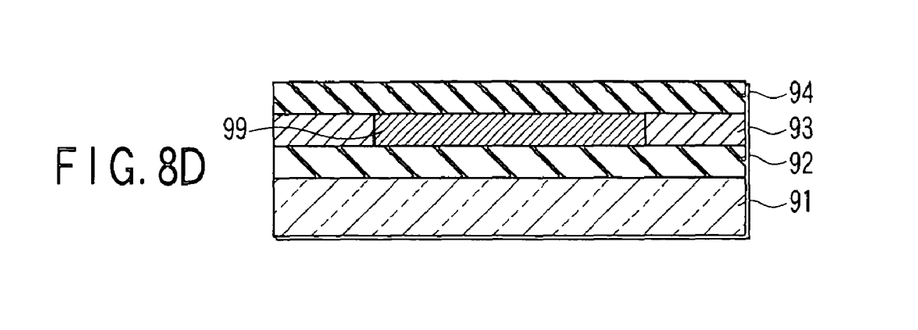

Next, as shown in FIG. 8C, flash lamp heating is conducted. As a result, as shown in FIG. 8D, the crystallized semiconductor thin film 97 becomes a monocrystallized semiconductor thin film 99. The surface morphology of the crystal grains of the crystallized semiconductor thin film 97 is quadrangular, and the plane orientation in the direction along the orientation flat of the insulating material substrate 91 is (100) plane. Therefore, according to the method of this embodiment, a quadrangular monocrystallized region array having (100) plane in one direction of the section of the insulating material substrate can be formed.

Embodiments of method of crystallizing a semiconductor device and crystallizing apparatus will be explained by referring to FIGS. 9A to 9C, 10, and 11A to 11D. In these embodiments, an excimer laser 101 (for example, XeCl, KrF, ArF) is used as a light source, but the invention should not be limited thereto.

Figure 9A:
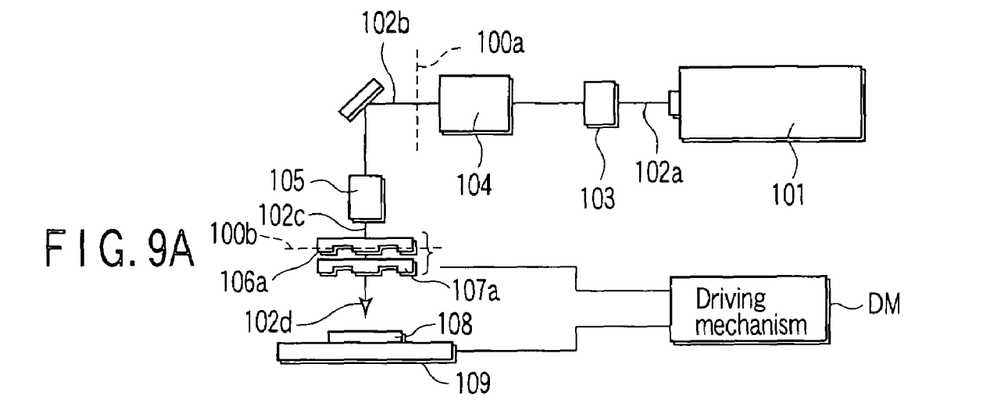
FIGS. 9A to 9C are schematic diagrams of mutually different phase modulated excimer laser crystallization apparatuses usable in the invention.

As shown in FIG. 9A, at the output side of the excimer laser 101 emitting pulsed laser beam 102a, an attenuator 103 for controlling the energy density (with the minimum value J1, and the maximum value J2 shown in FIG. 3) of the laser beam 102a and a homogenizing optical system 104 for homogenizing the intensity of the laser beam are disposed sequentially. The position indicated by reference numeral 100a is an image-focusing plane (focal plane) of the homogenizing optical system 104. At the output side of the homogenizing optical system 104, a projector lens 105 for equally multiplying or reducing the focal plane 100a of the homogenizing optical system is disposed through a 90-degree reflector. A first phase shifter 106a is disposed at an image-focusing plane 100b (focus position) of the projector lens 105, while a second phase shifter 107a is disposed at a position deviated from the focal position (defocus position). The second phase shifter 107a may be composed of a plurality of phase shifters, for example, two phase shifters arranged with their phase shift directions orthogonally crossing. The first phase shifter 106a is intended to form a steep bottom in the laser beam intensity distribution 61 shown in FIG. 5A. The second phase shifter 107a is intended to form a gradient necessary for crystal growth in the lateral direction in the laser beam intensity distribution 61 shown in FIG. 5A. That is, in the laser beam intensity distribution 61 shown in FIG. 5A, the shape of steep bottom of the laser beam intensity distribution at the minimum light intensity spot 42a is formed by the first phase shifter 106a. In the laser beam intensity distribution 61, the shape of the maximum laser beam intensity distribution from the minimum light intensity spot 42a is the gradient necessary for crystal growth in the lateral direction, and is formed by the second phase shifter 107a.

The first and second phase shifters 106a, 107a are fixed on the optical axis by holders (not shown). The holders are incorporated in a driving mechanism DM such as a goniometer having a mechanism moving the holders in a direction along the optical axis and also in a direction vertical thereto, and a mechanism rotating the two axes.

By using such two phase shifters (106a, 107a), the minimum light intensity spot 42a can be created as a point of minimum in both axial directions. However, by using one phase shifter only, and using a minimum light intensity line having a minimum portion on a straight line, the irradiated portion on this line acts as the point at which the crystal grain generates, and crystal grains having similar triangular crystal grain 54a can be grown, as confirmed by the present inventors. Thus, two phase shifters are not always required.

At the output side of the second phase shifter 107a, the target 108 mounted on the stage 109 is positioned. This stage 109 is movable in X-direction and Y-direction, and can shift the target 108 in the horizontal direction relatively to the second phase shifter 107a.

The target 108 irradiated with the laser as above is monocrystallized through the heating step with the flash lamp in the flash lamp heating device. In the flash lamp heating device (FIG. 10), the target 108 is mounted on the supporting plate 116. The plate may be furnished with heating means for preheating.

After vacuum evacuation by a vacuum evacuation device (not shown) connected to the flash lamp heating device, or after an inert gas such as Ar or $N_2$ is introduced in the flash lamp heating device, the flash lamp heating process is started. To achieve desired flash lamp lighting conditions, the voltage, current density, and gas pressure are properly adjusted, and the target 108 is processed by one or plural times of flash lamp irradiation.

The flash lamp heating device noted above is a separate device from the laser irradiation apparatus, but it may be formed as a cluster having a multichamber connected to the laser irradiation apparatus. In this case, contamination from atmosphere or pollution by particles can be reduced.

The action of crystallization in the laser irradiation apparatus of the construction noted above will be explained below.

The pulse laser beam 102a emitted from the excimer laser 101 is controlled of energy density by the attenuator 103, and enters the homogenizing optical system 104 where it is formed into the laser beam 102b of uniform intensity, which is then passed to the reflector. At the reflector, the laser beam 102b is deflected by 90 degrees toward the target 108, and is passed to the projector lens 105. The projector lens 105 sends the incident laser beam 102b to the surface of the target as laser beam 102d modulated by the first and second phase shifters 106a, 107a. The target 108 is actually a laminated thin film substrate having the semiconductor thin film 83 or 93 shown, for example, in FIGS. 7A to 7D and 8A to 8D.

The laser beam intensity distribution (image) formed by modulation by the second phase shifter 107a is characterized by, for example, as shown in the laser beam intensity distribution 61 in FIG. 5A, uniform intensity, macroscopically at millimeter level, and modulated intensity, microscopically at micron level. By laser irradiation with the laser beam having such laser beam intensity distribution 61, a crystallized thin film having crystal grains controlled in position as shown in scanning electron microscope image in FIG. 5B can be formed. In FIG. 5B, reference numeral 62a is a crystallization start point, and 63a is a crystallization end position.

With the energy density of laser beam optimized by the attenuator 103, when the laser beam 102d is irradiated onto the surface of the target 108, the semiconductor thin film of the target 108 absorbs the laser beam 102d and is increased in temperature. Here, in the intensity modulated region of the laser beam 102d, it is desirable that the semiconductor thin film at the minimum intensity is in molten state down to the vicinity of the interface with the underlying layer, and at the maximum intensity, the temperature is at a level not to evaporate the semiconductor thin film.

Figure 11B:
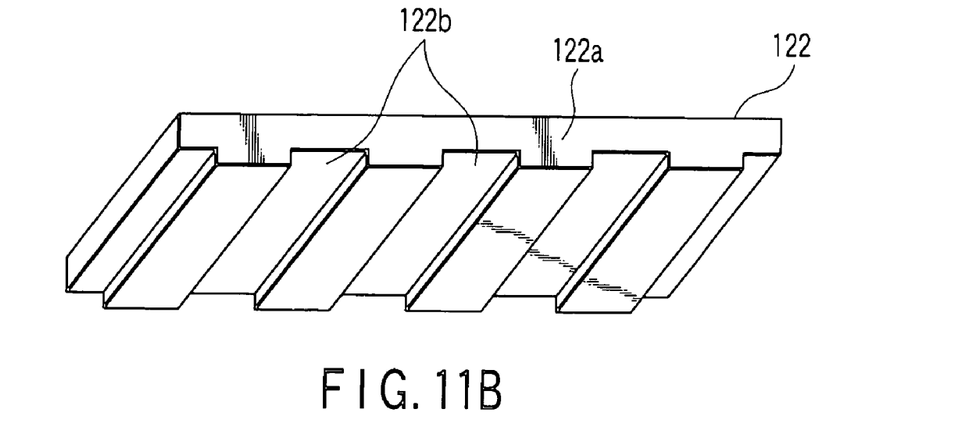
FIG. 11B is a perspective view of a phase shifter for positioning.

The first and second phase shifters 106a, 107a are made of transparent substrates, as indicated by reference numerals 121 and 122 in FIGS. 11A and 11B, for example, an elongated rectangular grooves 121b (122b) constantly space apart from each other are formed on one side of a synthetic quartz plate 121a (122a), so that the structure has steps. The step height (groove depth) $\Delta t$ corresponds to phase difference $\theta$ of the output laser beam. This phase difference $\theta$ is given as $\theta = 2\pi \Delta t (n-1)/\lambda$. Here, $\lambda$ is the wavelength of the laser, and n is refractive index of the synthetic quartz plate. For example, when using a KrF excimer laser with wavelength of 248 nm, the refractive index is 1.508, and the phase difference becomes 180 degrees when the step height $\Delta t$ is 244 nm. Such phase shifters 121 (106a), 122 (107a) are disposed at positions shown in FIG. 9A, with their groves orthogonally crossing. To form a step on the surface of the synthetic quartz plate 121a (122a), applicable methods include an etching method by reactive ion etching, a direct processing method by using focused ion beam, and a method in which an amorphous silicon thin film is formed on synthetic quartz substrate and thermally oxidized after patterning. The phase shifters 121, 122 are different in the groove dimensions and pitch P (interval between phase shift lines) in the drawing, but they may be also formed equally.

The phase shifter may also have an effect of forming light intensity distribution by light absorption, in addition to the surface step. For this purpose, for example, on one side of the synthetic quartz plate 121a (122a), a light absorption film (a film of SiN, SiON, Ge, etc.) is formed and patterned. By using such a phase shifter 121 (122), the light intensity distribution is changed by absorption coefficient and film thickness of the light absorption film. This method is useful when forming in that region of the phase shifter at which it is desired to suppress light intensity oscillation.

Also by forming a micro lens on the surface of the phase shifter, an effect of forming a light intensity distribution may be also added.

Figure 11C:
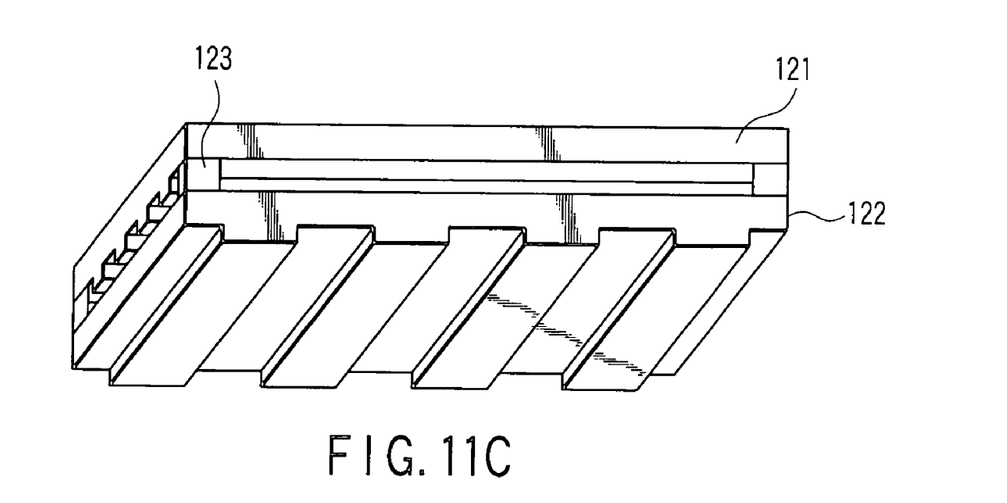
FIGS. 11C and 11D are perspective views showing shifters having mutually difference configurations, in which the phase shifter for annealing is integrated with the phase shifter for positioning.
Figure 11D:
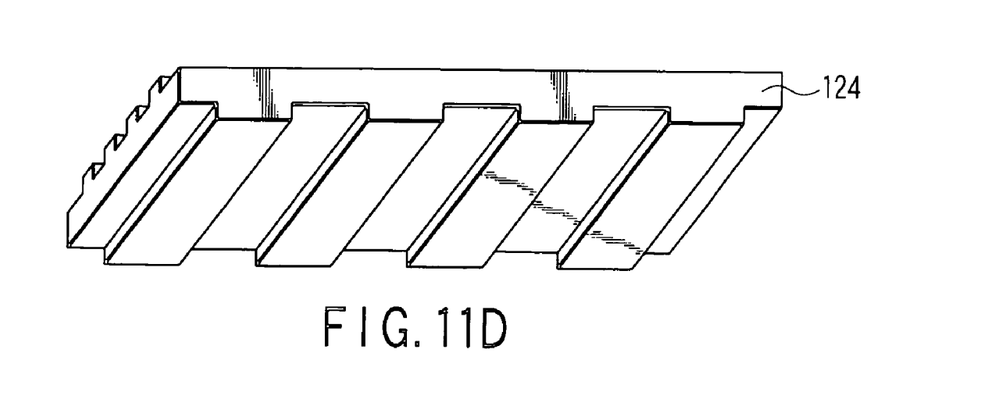

The first phase shifter 121 and second phase shifter 122 may be formed into an integral structure, by disposing on both sides of four spacers 123 provided at the corners as shown in FIG. 11C. Further, to prevent dust particles from entering spaces between the phase shifters, frame-shaped shield spacers may be provided at the four sides, instead of the four spacers. Alternatively, as shown in FIG. 11D, the first phase shifter and second phase shifter may be formed as an integral phase shifter 124 formed on one synthetic quartz substrate (common transparent substrate). In this case, on one side, the groove or step of the first phase shifter is formed, and on other side, the groove or step of the second phase shifter is formed. Further, the first phase shifter and second phase shifter may be exchanged in position on the optical path.

The light intensity distribution obtained by such first and second phase shifters 106a, 107a is determined by the geometric structure of the surface step of the transparent substrate (synthetic quartz substrate), angle of incident light, or spatial interference of light. Depending on the required light intensity, the second phase shifter 107a alone may be sufficient.

In the embodiment shown in FIG. 9A, the position of the surface of the target 108 may be set at the focal plane of the projector lens 105, and, for example, the phase shifter 106a may be disposed on the focal plane 10a of the homogenizing optical system 104. In this case, as compared with the mode in FIG. 9A, freedom of design of light intensity distribution may be limited, but the uniformity is enhanced.

In further different embodiments of the apparatus explained below, substantially the same elements or parts as in the embodiment of FIG. 9A are identified with the same reference numerals and repeated explanation is omitted.

Figure 9B:
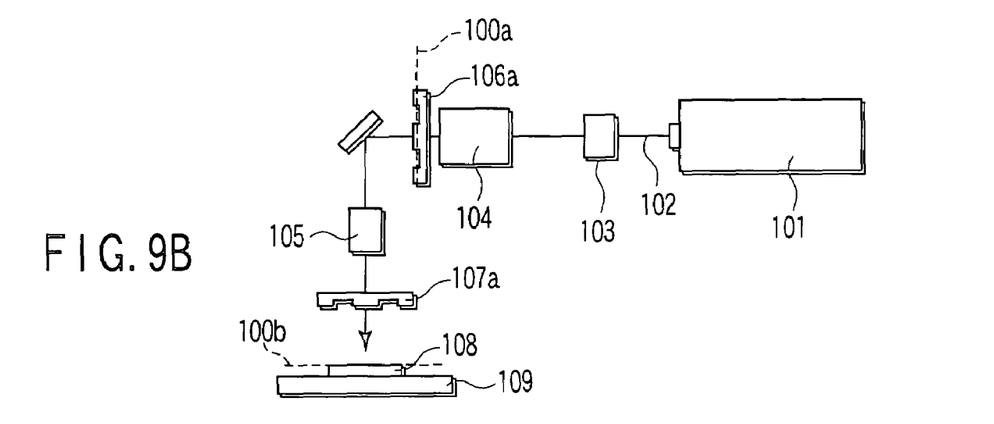

Another embodiment of the laser irradiation apparatus is shown in FIG. 9B.

In the apparatus shown in FIG. 9B, a first phase shifter 106a is disposed on the focal plane 100a of the homogenizing optical system 104, and the surface of the target 108 is placed on the focal position of the image-focusing lens 105. A second phase shifter 107a is disposed at a position out of focus of image-focusing lens 105. In this case, as compared with the variation noted above of the embodiment of FIG. 9A, freedom of design of light intensity distribution is improved, but the intensity modulation of the first phase shifter 106a is limited by the resolution of the projector lens.

Figure 9C:
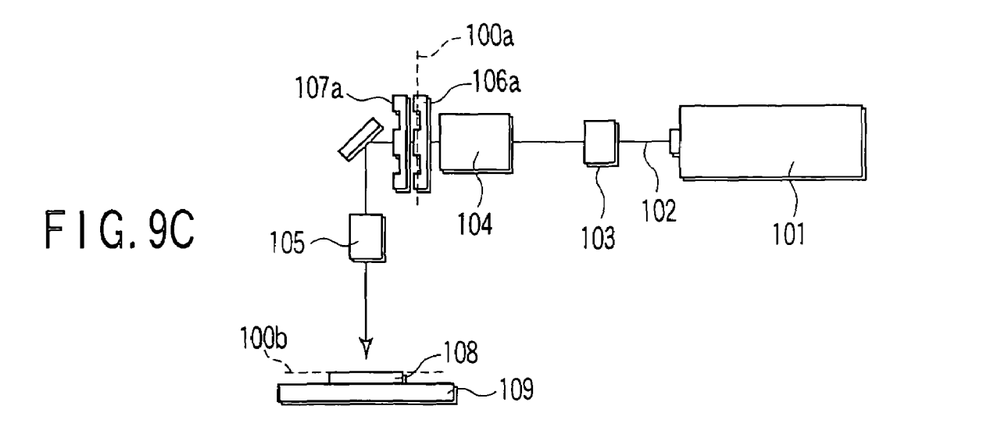

Another mode of the laser irradiation apparatus is shown in FIG. 9C.

In the apparatus shown in FIG. 9C, the first phase shifter 106a is disposed on the focal plane 100a of the homogenizing optical system 104, and the second phase shifter 107a is disposed at the position out of focus of the homogenizing optical system 104. The surface of the target 108 is placed on the focal position of the projector lens 105. In this apparatus, since the phase shifter is not present near the target surface, degree of freedom around the stage 109 is improved. However, the light intensity modulation is limited by the resolution of the projector lens.

In the foregoing embodiments, as the crystallization process by laser beam, crystal growth in the lateral direction using the light modulator 7 is explained. However, it is envisaged to crystallize by homogenized laser beam irradiation having enough energy for melting the non-monocrystalline semiconductor thin film, without modulating by the light modulator 7.

What is claimed is:

1. A method of manufacturing a semiconductor device, comprising:
    irradiating a region to be crystallized of a non-monocrystalline semiconductor film with laser beam modulated by an optical modulator to have light intensity distribution having a minimum light intensity line or minimum light intensity spot to crystallize the region;
    moving the region to be irradiated by the laser, effecting the crystallization; and
    heating the crystallized region by irradiating pulsed light from a flash lamp onto the crystallized region, covering a wide area,
    wherein, in the irradiating, the laser beam of light intensity distribution having the minimum light intensity line or minimum light intensity spot is formed by the optical modulator.

2. The method according to claim 1, wherein:
    the irradiating includes forming crystal grains whose plane orientation in a direction of crystal growth is a predetermined plane and which grow faster than other crystal grains; and
    the heating includes growing, using the crystal grains as crystal nucleus, crystal grains whose plane orientation in a direction of crystal growth is the predetermined plane, in the semiconductor thin film.

3. The method according to claim 1, wherein the optical modulator has a phase shifter which outputs the laser beam of light intensity distribution having a minimum light intensity line or minimum light intensity spot by modulating a phase of incident laser beam.

4. The method according to claim 1, wherein the irradiating the region is carried out in a laser irradiating apparatus, and the heating the crystallized region is carried out in a flash lamp heating device which is separate from the laser irradiating apparatus.

5. A method of manufacturing a semiconductor device, comprising:
    irradiating a region to be crystallized of a non-monocrystalline semiconductor film with laser beam modulated by an optical modulator to have light intensity distribution having a minimum light intensity line or minimum light intensity spot to crystallize the region; and
    heating the crystallized region by irradiating light from a flash lamp onto the crystallized region,
    wherein the irradiation includes forming crystal grains which have triangular shape when viewed from one side, and whose plane orientation in a direction of crystal growth is (100) plane, and
    the heating includes growing, using the triangular crystal grains as crystal nucleus, crystal grains which have nearly rectangular surface shape as viewed from one side, and whose plane orientation in a direction of crystal growth is (100) plane, in the semiconductor thin film.

* * * * *